United States Patent [19]
Kellmann et al.

[11] Patent Number: 5,436,580
[45] Date of Patent: Jul. 25, 1995

[54] METHOD AND CIRCUITRY FOR DETERMINING THE BEGINNING OF ECHO PULSES

[75] Inventors: Reinhard Kellmann, Kiel; Manfred Selke, Neumuenster; Lars I. Hauschultz, Juebek, all of Germany

[73] Assignee: Allied-Signal Inc., Morristown, N.J.

[21] Appl. No.: 175,916

[22] Filed: Dec. 30, 1993

[30] Foreign Application Priority Data

Jan. 20, 1993 [DE] Germany .................. 43 01 341.4

[51] Int. Cl.[6] ............................................. H03K 5/22
[52] U.S. Cl. ........................................ 327/24; 327/37; 327/72; 327/74
[58] Field of Search .............. 327/20, 24, 37, 74, 327/77, 78, 72, 335, 39, 50

[56] References Cited

U.S. PATENT DOCUMENTS

| | | | |
|---|---|---|---|
| 3,638,183 | 1/1972 | Progler et al. | 340/146.1 |
| 3,812,421 | 5/1974 | La Rocca | 324/58.5 B |
| 4,101,789 | 7/1978 | Ruhnan | 307/261 |
| 4,176,337 | 11/1979 | Aechter et al. | 367/131 |
| 4,222,008 | 9/1980 | Mezrich | 328/28 |
| 4,292,593 | 9/1981 | de Jager et al. | 329/50 |
| 4,713,553 | 12/1987 | Townsend et al. | 307/64 |
| 4,823,227 | 4/1989 | Grant | 361/90 |
| 5,185,686 | 2/1993 | Hansen et al. | 361/45 |

FOREIGN PATENT DOCUMENTS

0185133B1  6/1991  European Pat. Off. .

*Primary Examiner*—Timothy P. Callahan
*Assistant Examiner*—My-Trang Nu Ton
*Attorney, Agent, or Firm*—John R. Rafter

[57] ABSTRACT

A method and circuit for accurately determining the leading edge timing of a pulse of high frequency carrier signal at a receiver which substantially simultaneously receives the same pulse over multiple transmission paths resulting in distortion of the pulse envelope. The amplitude of the pulse envelope is compared with the amplitude of the derivative of the pulse envelope and with a reference threshold amplitude. The leading edge of a pulse is indicated when the amplitude of the pulse envelope exceeds both the amplitude of the derivative and the reference threshold.

6 Claims, 2 Drawing Sheets

METHOD AND CIRCUITRY FOR DETERMINING THE BEGINNING OF ECHO PULSES

BACKGROUND OF THE INVENTION

The present invention relates generally to accurately determining the timing of the leading edge of a pulse of high frequency carrier signal, and, more specifically, to a method and apparatus for determining the leading edge timing of such a pulse at a receiver which receives the same pulse over multiple transmission paths of different lengths resulting in distortion of the pulse envelope.

In the field of ultrasonic position detection, pulses of high frequency carrier signal radiated by a signal source are received by several receivers spaced apart from one another. The distance and direction to the signal source may be computed from measured travel times of the pulses to the individual receivers. For accurate determination of the location of the signal source in such an arrangement, it is essential that each of the receivers recognize the same point in the received signal envelope as the beginning of the pulse for purposes of computing the travel times, and hence, direction and distance.

In most cases, a pulse will travel along multiple paths of different lengths between the signal source and each receiver. This results in a received pulse envelope which is stretched and distorted relative to the transmitted pulse, and which may not have a well defined or predictable leading edge. Further, it is not clear at which point in time during the leading edge of the envelope the pulse should be considered as having been received. Comparison of only signal amplitude with a predetermined threshold may not provide reliable criteria for determining pulse timing because the individual transmission paths will generally produce different signal attenuations, with attendant effects on the slope of the leading edge of the signal envelope. Further, the timing uncertainties are not avoided by adding a pulse shaping network which is triggered to initiate a square wave pulse solely in response to the received signal envelope reaching an amplitude threshold.

However, improvements in determining pulse timing can be realized by a variety of known approaches which combine amplitude threshholding with other detection criteria. For example, in one prior art approach, the slope of the leading edge of the received signal is evaluated by differentiating the signal envelope and detecting when the value of its derivative falls below a threshold comparison value. A valid pulse is determined to exist when one, and only one, negative crossing of the comparison value occurs during a time interval which commences when the envelope amplitude reaches a predetermined small value, and which has a duration not longer than the transient response period of the receiving transducer.

Although such an approach is capable of achieving detection which is relatively unaffected by many of the causes of pulse timing uncertainties, it requires somewhat complex signal processing operations and circuitry. Conversely, the applicants have provided a unique approach which achieves accurate and reliable determination of echo pulse timing with simple, low cost signal processing operations and circuitry.

SUMMARY OF THE INVENTION

The invention is a method and circuitry for accurately determining the timing of a pulse from a received pulse signal which may be distorted due to effects introduced by the path over which the received pulse signal is transmitted, the method and circuitry involving comparison of the received signal with both a time dependent first derivative thereof and an amplitude threshold. Signals resulting from these comparisons are combined according to an AND logic function, and used to indicate beginning of a pulse when a characteristic of the received signal exceeds both its first derivative and a predetermined amplitude threshold. The method includes the steps of developing a first derivative of the received signal, comparing the received signal with its derivative, producing a first predetermined signal only when the amplitude of the received signal exceeds its derivative, producing a second predetermined signal only when the amplitude of the received signal exceeds a predetermined amplitude threshold, combining the first and second signals according to a logic function which produces a third predetermined signal only upon simultaneous occurrence of the first and second predetermined signals, and indicating the beginning of a pulse in response to the third predetermined signal. The step of developing a first derivative may include the steps of producing an envelope signal corresponding to the envelope of the received signal and computing the derivative of the envelope signal.

Circuitry in accordance with the invention includes first and second operational amplifiers whose noninverting inputs are connected to be supplied with the received signal envelope, a differentiator for supplying the derivative of the received signal envelope to the inverting input of the first operational amplifier and means for supplying an amplitude threshold signal to the inverting input terminal of the second operational amplifier. The outputs of the first and second operational amplifiers are supplied to an AND logic circuit whose output signal indicates the leading edge of a received pulse. The output signal of the AND circuit may be supplied to a flip flop memory element to provide a continuing pulse indication. The amplitude threshold may be produced by a potentiometer to provide for threshold adjustment.

Accordingly, it is a primary object of the invention to provide a method and circuitry which consistently responds to gradually increasing amplitude of a received pulse envelope to precisely detect the beginning of a transmitted pulse so as to permit accurate determination of pulse travel time and duration.

DESCRIPTION OF THE PREFERRED EMBODIMENT

For purposes of facilitating an understanding of the applicants' invention, an analog implementation of the inventive circuitry is shown and described. However, it is pointed out that a digital implementation is equally satisfactory, and may be preferable in some applications. It is also pointed out that, although the invention is described in connection with a system including several antennas or hydrophones for receiving radiated signals, it is also useful in connection with passive or active target position determining applications involving very short signal transmission paths.

Figure 1:
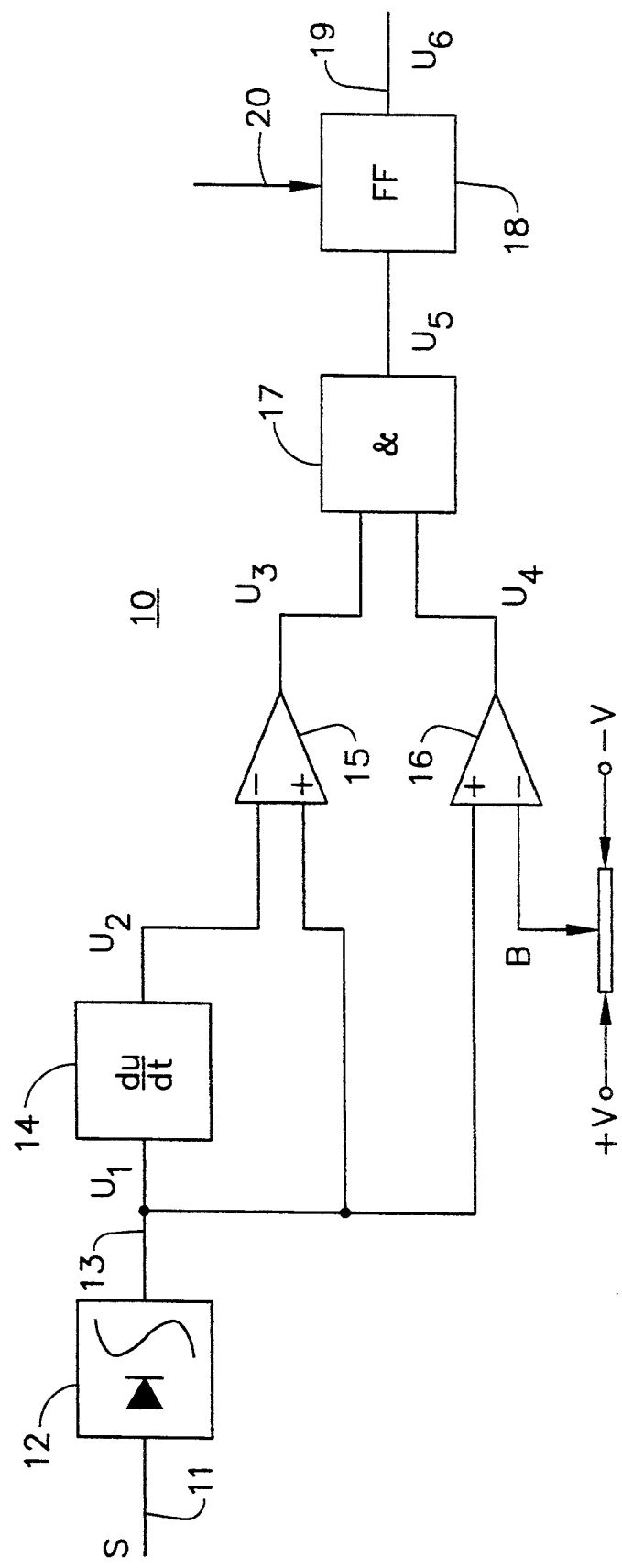
FIG. 1 is a block diagram of a circuit in accordance with the applicants' invention for determining pulse timing from a distorted received signal envelope.
Figure 2A:
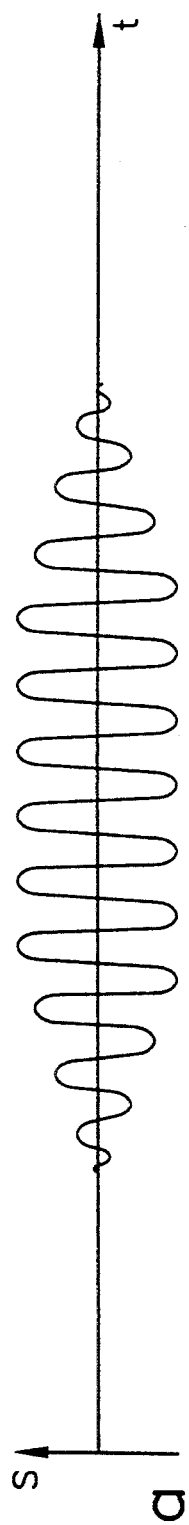
FIG. 2 illustrates waveforms representing signals produced at various points in the circuit of FIG. 1.

Turning now to FIG. 1, reference numeral 10 generally identifies an ultrasonic position determining system or echo sounding system which may be designed to operate at a signal frequency of between 10 and 100 kHz. Pulses of such a high frequency signal, of which one pulse is illustrated in FIG. 2(a), are received at an input terminal 11 of an integrating envelope rectifier 12 having an output terminal 13 which a DC voltage representing the received signal envelope is produced. With such an input signal, envelope rectifier 12 produces an output signal $U_1$ illustrated in FIG. 2(b). This voltage has a gradually rising leading edge and a gradually falling trailing edge, with no clearly defined points indicating the beginning and ending of a pulse.

Figure 2B:
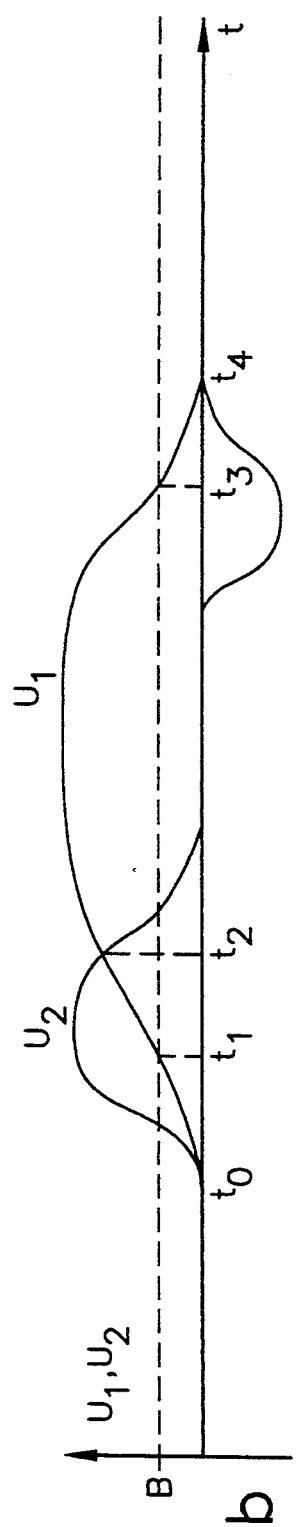

If the signal envelope amplitude were compared only with a predetermined threshold, such as represented by threshold amplitude B in FIG. 2(b), any changes in shape of the pulse envelope due to changing distance to a target or other variables could result in inaccuracies in determination of pulse timing. In particular, such variables would generally change the leading edge slope of the signal envelope, and alter the timing point at which a pulse was determined to begin.

Figure 2C:
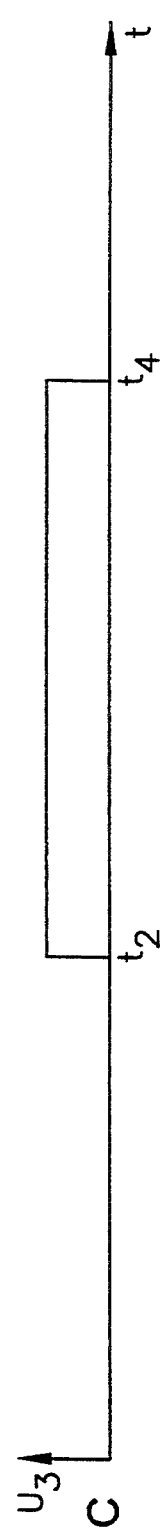

In the present invention, the foregoing problem is overcome by supplying the output signal of envelope rectifier 12 to a differentiator circuit 14 which produces a signal indicative of the time dependent first derivative of the received signal envelope, as illustrated by waveform $U_2$ in FIG. 2(b). Signals indicative of the received signal envelope and first derivative thereof are respectively supplied to the noninverting and inverting inputs of a second operational amplifier 15 which produces a predetermined output signal $U_3$ only when the magnitude of the received signal envelope exceeds the derivative. The output voltage of operational amplifier 15 is illustrated in FIG. 2(c).

Figure 2D:
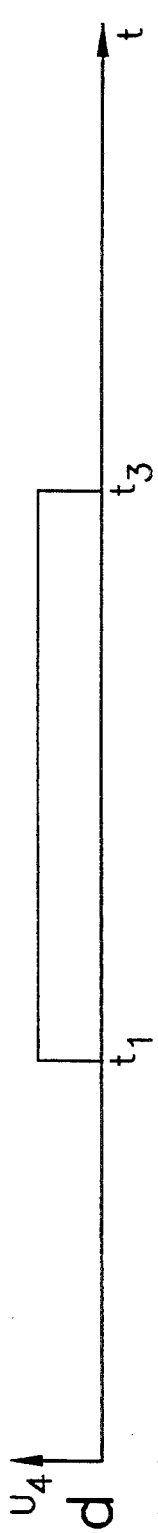

The arrangement so far described does not make any accommodation for short term interference, which, in some circumstances (e.g., low level received signals), can produce inaccurate results. This problem is overcome in the applicants' invention by providing a first operational amplifier 16 whose noninverting input terminal is connected to receive the output signal of envelope rectifier 12, and whose inverting input is provided with a threshold reference voltage representing threshold amplitude B. As illustrated in FIG. 1, the threshold reference voltage may be provided by a potentiometer 17 whose resistance element is connected between the positive and negative voltage supply sources $+V$ and $-V$, respectively. The voltage representing threshold amplitude B is produced at the wiper of potentiometer 17, and may be adjusted by repositioning the wiper. Operational amplifier 16 produces a predetermined output signal $U_4$ only when the received signal envelope has an amplitude greater than threshold amplitude B, as illustrated in FIG. 2(d).

Figure 2E:
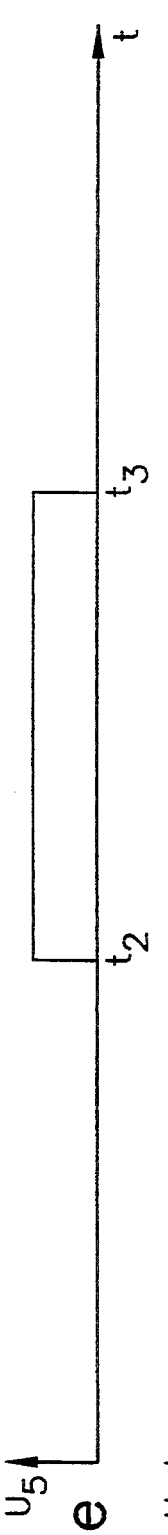
Figure 2F:
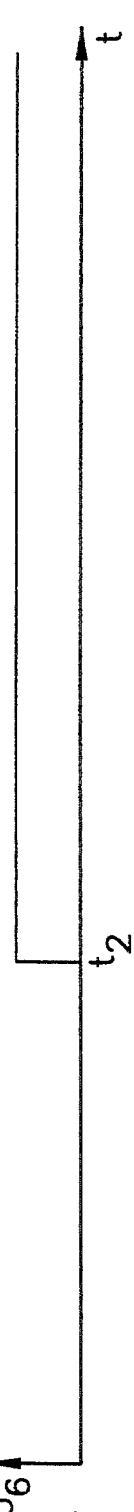

The output signals of operational amplifiers 15 and 16 are supplied to an AND logic circuit 17 which produces an output signal $U_5$ illustrated in FIG. 2(e) only when both operational amplifiers 15 and 16 are producing their predetermined output signals. The output signal of AND logic element 17 is supplied to the set input terminal of a flip flop 18 so as to cause a high signal $U_6$ at its output terminal 19, as illustrated in FIG. 2(f), until a reset signal is supplied to reset terminal 20 of flip flop 18.

The above-described arrangement avoids an erroneous output when, for example, a low level received signal which has an envelope voltage below threshold amplitude B includes variations which result in the envelope momentarily having a higher amplitude than its derivative.

Since the circuit of the applicants' invention essentially consists of components for taking the derivative of the input signal, making signal comparisons and performing logic functions, invention can easily be accomplished by a microprocessor programmed to perform those functions. Further, the invention is not only useful in echo sounding and other ultrasonic system applications, but may also find application in other systems in which it is necessary to accurately determine the leading edge of a pulse in an envelope having a poorly defined leading edge.

In accordance with the foregoing description, the applicants have provided a method and circuitry for accurately determining pulse timing in a simple, reliable, low cost manner. Although a particular embodiment has been shown and described for illustrative purposes, a variety of modifications and other embodiments within the applicants' contemplation and teaching will be apparent to those of ordinary skill in the relevant arts. It is not intended that coverage be limited to the embodiment shown, but only by the terms of the following claims.

The embodiments of the invention in which an exclusive property or right is claimed are defined as follows:

1. A method for determining a timing of a leading edge of a pulse within a received signal which may have a poorly defined leading edge as a result of effects introduced by the path over which received signal is transmitted, the method comprising the steps of:

developing a time dependent first derivative of the received signal;

comparing the received signal with the first derivative thereof;

producing a first output signal when a characteristic of the received signal exceeds the first derivative thereof;

comparing the received signal with a predetermined threshold signal;

producing a second output signal when the received signal exceeds the predetermined threshold signal; and indicating presence of the leading edge of a pulse upon simultaneous occurrence of both the first and second output signals.

2. The method of claim 1 wherein the step of developing a time dependent first derivative comprises the steps of:

processing the received signal to produce an envelope signal corresponding to the envelope of the received signal; and computing the first derivative of the envelope signal.

3. A circuit for determining a timing of a leading edge of a pulse signal within a received signal which may have a poorly defined leading edge as a result of effects introduced by the path over which the received signal is transmitted, the circuit including a first and second operational amplifiers, of which the first is connected to receive a threshold voltage at its inverting input terminal, the circuit further comprising:

an envelope rectifier circuit operable to produce an envelope signal corresponding to the envelope of the received signal;

first connecting means for supplying the envelope signal from said envelope rectifier circuit to the noninverting input terminals of the first and second operational amplifiers;

a differentiating circuit connected to receive the envelope signal from said envelope rectifier circuit, and operable to produce a derivative signal corresponding to the time dependent first derivative of the envelope signal;

second connecting means for supplying the derivative signal from said differentiating circuit to the inverting input terminal of the second operational amplifier; and an AND logic circuit connected to receive an output signals of the first and second operational amplifiers, and operable to indicate presence of the leading edge of a pulse when the output signals of the first and second operational amplifiers indicate that the amplitude of the envelope signal simultaneously exceeds both the time derivative of the envelope signal and the threshold voltage.

4. The circuit of claim 3 further including a memory element connected to receive an output of said AND logic circuit, said memory circuit being operable to provide a continuous indication of a pulse following receipt of the output signal from said AND logic circuit.

5. The circuit of claim 3 further including a variable amplitude voltage source for producing an adjustable threshold voltage.

6. The circuit of claim 4 further including a variable amplitude voltage source for producing an adjustable threshold voltage.

* * * * *